United States Patent [19]

Doemens et al.

[11] 4,305,097
[45] Dec. 8, 1981

[54] AUTOMATED OPTO-ELECTRONIC TEST SYSTEM FOR QUALITY CONTROL OF TWO-DIMENSIONAL ELEMENTS WITH HIGH GEOMETRIC FIGURE DENSITY

[75] Inventors: Güenter Doemens, Holzkirchen; Ulrich Hendricks, Neuried; Richard Schneider, Oberhaching; Karl Wild, Augsburg, all of Fed. Rep. of Germany

[73] Assignee: Siemens Aktiengesellschaft, Berlin & Munich, Fed. Rep. of Germany

[21] Appl. No.: 161,076

[22] Filed: Jun. 19, 1980

[30] Foreign Application Priority Data

Jul. 23, 1979 [DE] Fed. Rep. of Germany ....... 2929846

[51] Int. Cl.[3] .............................................. H04N 7/18
[52] U.S. Cl. .................................. 358/101; 358/903; 364/490; 364/491; 356/375
[58] Field of Search ................. 358/101, 107, 93, 903; 356/237, 399, 426, 375; 250/562, 572; 364/559, 490, 491; 340/146.3 H

[56] References Cited

U.S. PATENT DOCUMENTS

| 4,208,675 | 6/1980 | Bajon et al. ........................ 358/101 |
| 4,212,031 | 7/1980 | Schmitt et al. ..................... 358/101 |
| 4,238,780 | 12/1980 | Doemens ........................... 358/101 |

OTHER PUBLICATIONS

Goto, et al., "An Automatic Inspection System for Mask Patterns", 1978, pp. 970-974, Proc. of the Fourth Inter. Joint Conf. on Pattern Recognition.
Wirz, et al., "Automatic Vector Distance Comparator Projections", Feinwerktechnik & Messtechnik 84 (1976), 7, p. 330-334.

Primary Examiner—Marc E. Bookbinder
Assistant Examiner—Edward L. Coles
Attorney, Agent, or Firm—Hill, Van Santen, Steadman, Chiara & Simpson

[57] ABSTRACT

An automated opto-electronic test system for quality control of two-dimensional elements with high geometric figure density, such as printed circuits, intermediate printed circuit products, and printing tools has a semiconductor image sensor disposed above a compound table having a position sensor which moves the test specimen beneath a lens in a meandering path at a velocity which is known relative to the semiconductor image sensor. The signals from the image sensor are first analyzed in an analog signal pre-precessor to which are connected a number of error recognition circuits operating in parallel each of which produces an error report which is transmitted to an error coordinating circuit. The error reports are therein associated with position coordinates on the test specimen which are supplied by the position sensor of the compound table and stored until a complete scan of the test specimen has been undertaken and are subsequently employed to move the test specimen to the positions at which the errors occur for visual examination such as by magnification. If the test specimen is a printed circuit, tests which are undertaken are a minimum geometry test measuring respective track and insulation widths, a solder eye test and a special geometry test for open and short circuits.

20 Claims, 9 Drawing Figures

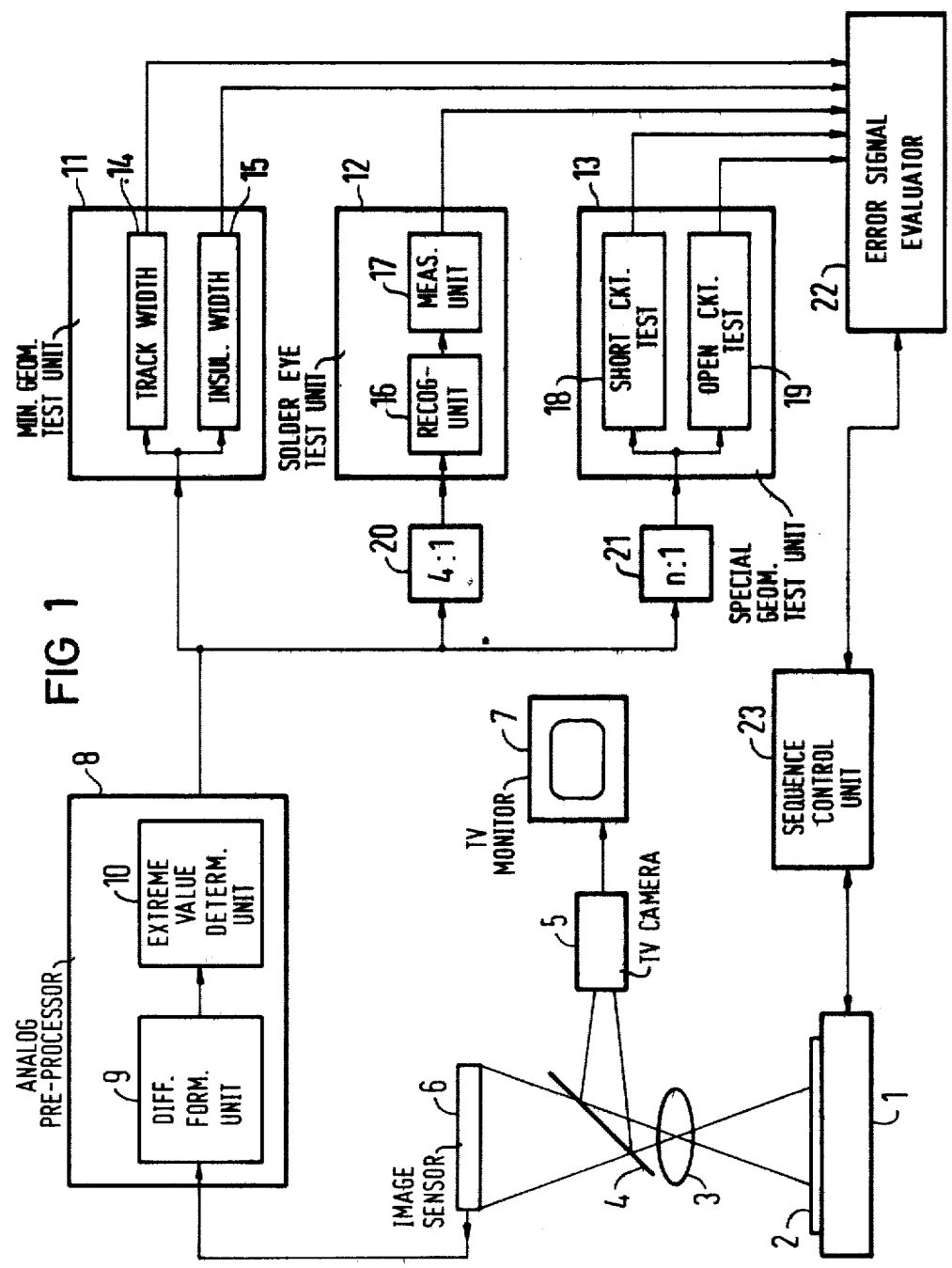

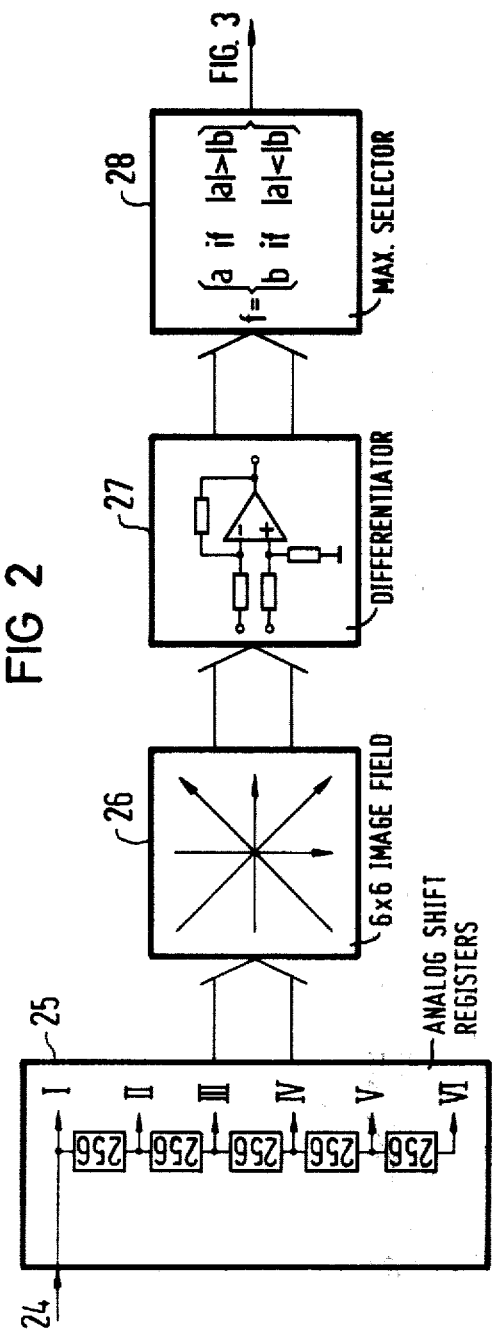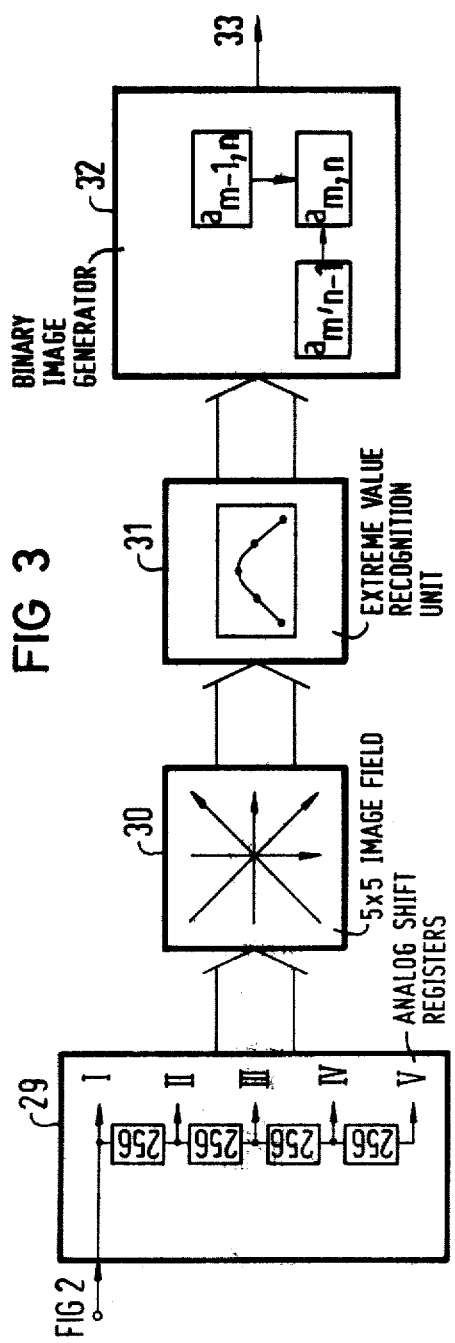

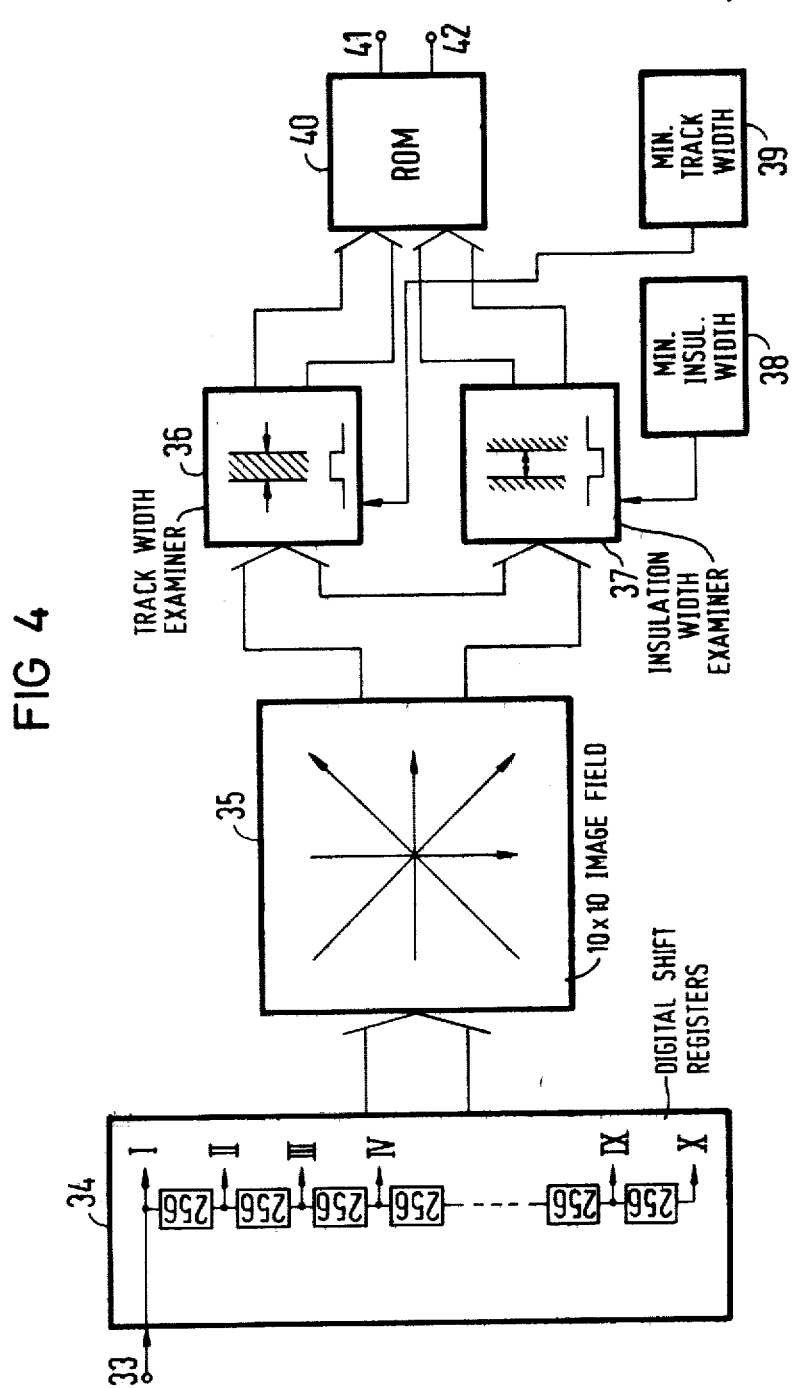

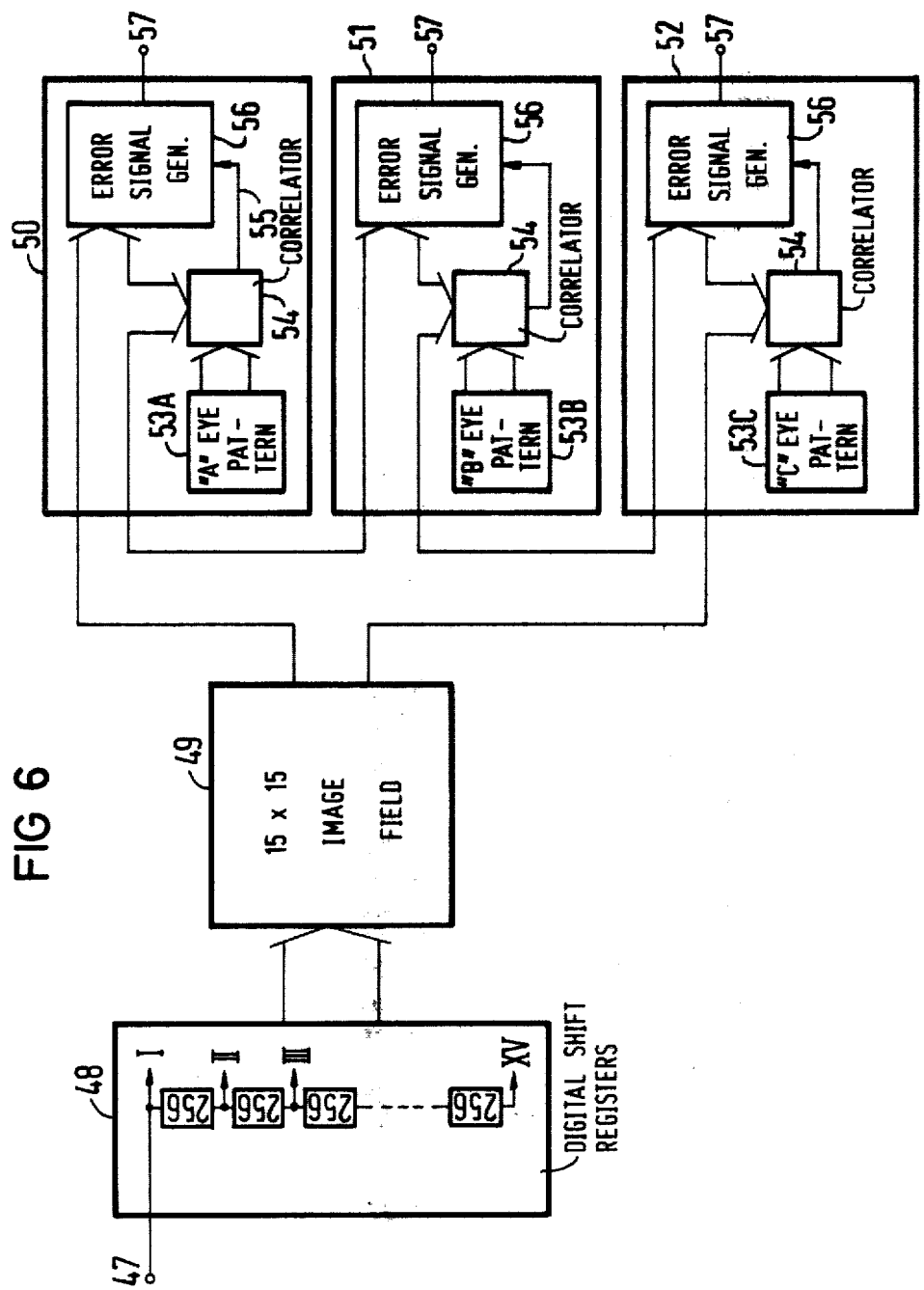

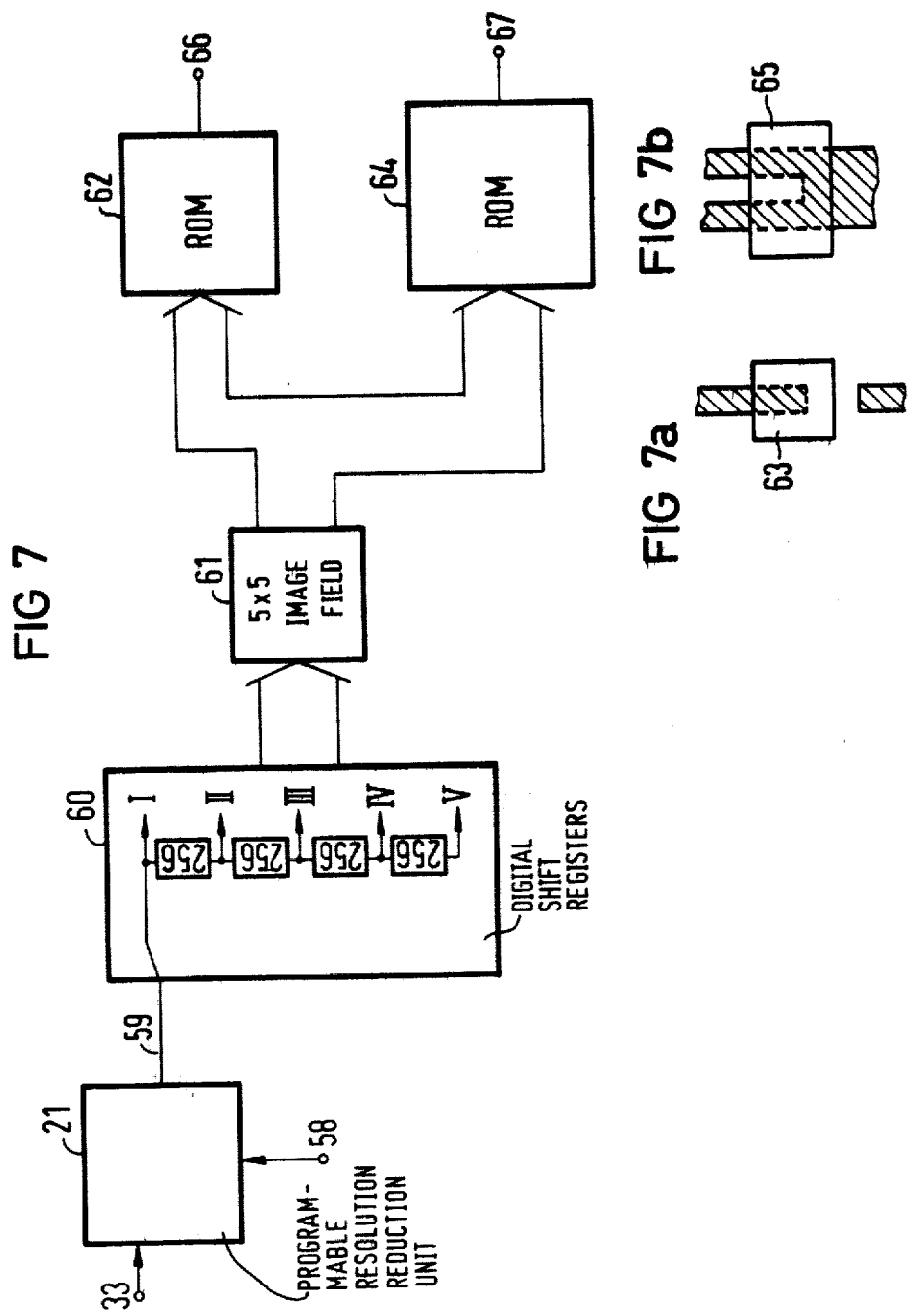

AUTOMATED OPTO-ELECTRONIC TEST SYSTEM FOR QUALITY CONTROL OF TWO-DIMENSIONAL ELEMENTS WITH HIGH GEOMETRIC FIGURE DENSITY

BACKGROUND OF THE INVENTION

1. Field of the Invention

The present invention relates to opto-electronic test systems for automated quality control of two dimensional bodies having a high geometric figure density, and in particular to such a test system which scans a test specimen and undertakes a number of different tests relating to the geometry thereof and stores any errors with associated position coordinates for subsequent visual examination.

2. Background of the Invention

Many defects in two-dimensional elements having high geometric figure density such as, for example, printed circuits, intermediate products utilized in the manufacture of printed circuits, and printing tools, can only be found by means of an optical quality control. Particularly in the quality control of intermediate products such as, for example, structures in developed photo layers, as well as in the case of printing tools, conventional test systems are completely dependent upon the visual inspection of an optical image of the test specimen. Such testing is becoming increasingly difficult and subject to inaccuracies as a result of the continuing efforts to decrease the size of printed circuits and increase the track density. In particular, testing for localized short circuits and track interruptions resulting in open circuits is exceedingly difficult by present methods. Moreover, such conventional methods require a substantial personnel outlay which results in a significant expense and in many instances cannot provide error recognition with the required certainty.

Some attempted solutions to this problem are found in an article in the periodical "Proceedings of the Fourth International Joint Conference on Pattern Recognition," 1978 at pages 970 through 974 wherein a method is described which has application only for testing printing tools, and in the periodical "Feinwerktechnik & Messtechnik," 84 (1976) 7, an article entitled "Automatischer Vektordistanzkomparator VDK Projectina" is found on pages 330 through 334 in which an opto-electronic device is described for testing flat objects having a high geometric figure density such as, for example, masks, hybrid circuits, printed circuits, serigraphs and the like. As described therein, such articles can be automatically tested as to completeness and congruency by means of a comparison with an original master pattern. The system described therein has the significant disadvantage of strong reflection fluctuations which occur in the printed circuits and is admittedly not yet developed for practical commercial use. Moreover, a precise adjustment of the test object within the test system is required for accurate results. Optical and opto-electronic auxiliary testing is therefore still undertaken utilizing, for example, projectors and/or television cameras.

SUMMARY OF THE INVENTION

It is an object of the present invention to provide an automatically functioning opto-electronic test system for quality control testing of two-dimensional articles having high geometric figure density which can be universally employed for printed circuits, intermediate printed circuit products, and printing tools which decreases testing cost outlay and increases recognition certainty.

The above object is inventively achieved in an opto-electronic test system which utilizes an image sensor which receives an image of a test specimen mounted on a movable compound table beneath the image sensor through a lens disposed between the table and the sensor. The image sensor may consist, for example, of semi-conductor photo-diode lines.

Signals received from the photo-diode lines are first analyzed in an analog signal pre-processor having a number of error recognition circuits connected thereto which operate in parallel and each of which provides an error report relating to a different error test. The error reports are transmitted to an error processing or management unit which associates the received error reports with spacial coordinates received from a position sensor connected to the compound table, and stores the errors and associated spacial coordinates until a complete scanning of the test specimen has been undertaken. The stored error and position signals are then utilized to move the test specimen to the positions at which the errors occur for classification by means of an observation device, which preferably allows the local area of the error to be seen in magnification.

The above method is not based on a comparison with a master, but rather undertakes a series of absolute tests utilizing test criteria obtained from a master. In order to discover the great majority of error types, therefore, a point-by-point comparison with a stored rated pattern or a physical master is not required. The herein-described system also allows processing of the slight fluctuating contrasts of the surface materials, which is particularly advantageous when the test specimen is a developed photo layer or a printed circuit having metallic runs, and moreover allows processing of a high information amount in a short time, so that articles having a particularly high structure density can be quickly and accurately tested. In a further embodiment of the invention, the analog signal pre-processor may be a series of charge-coupled shift registers which significantly reduces the circuit outlay in comparison with digital signal processors. In this embodiment, the analog signal pre-processor generates an edge structure having rising and falling edges by means of a four-dimensional differential pattern, for example, in a field of 6×6 intermediately stored analog image points. A number of differences with varying weightings are then combined per direction and the result of this operation which has the greatest magnitude among the various directions analyzed is allocated to the center of the field. By means of such processing, a suppression of local contrast deviations due to the textured nature of the surface of the test specimen is obtained.

A reconstruction of the binary image is then generated from the edge structure. The reconstruction ensues by means of extreme value recognition of the differential signal in the different directions as well as by an association of the individual results with spacial coordinates relating to earlier-examined portions of the test specimen.

In a preferred embodiment of the invention, the error recognition circuits functioning in parallel consist of a minimum geometry test which examines track width and insulation width, a test for larger continuous surface elements such as, for example, solder eyes, and a test for two special geometries such as a track interruption test for open circuits and a short circuit test undertaken between adjoining tracks. Any errors relating to structures tested in this manner can be determined in a single pass of the test specimen beneath the image sensor.

In another embodiment of the invention, an examination of the structure elements with respect to the dimensions of the element in a number of directions is undertaken at every image point and, in accordance with the classification of the image point, a comparison of these results with the acceptable minimal geometries of a pattern class is undertaken. The image content may be resolved, for example, into two classes, such as black and white, with a black image point allocated to a pattern representing, for example, insulation and a white image point allocated to a pattern class representing, for example, metallization.

The image information received at the input of the minimum geometry test unit in binary form is intermediately stored in a field of preferably 10×10 image points. By so doing, a chronologically parallel access to the individual image points is possible. The pattern for the implementation of the minimum geometry test existing in preferably four directions is examined with respect to continuous sequences of points as to whether the length of the sequences falls below the acceptable minimal geometry and an error indication is triggered only when the specified minimum geometries are not met simultaneously in a plurality, preferably two, adjoining spacial directions. As a result of the evaluation of the results of adjoining spatial directions within the 10×10 field, a suppression of the response behavior of the minimum geometry test unit to regular edge structures is obtained.

An electronic resolution reduction unit is preconnected to the unit for testing larger continuous circuit elements such as solder eyes so that an inspection of the test specimen for such structures can be simultaneously undertaken with differing geometrical precision. In contrast to conventional optical resolution reduction, only one pass of the test specimen is required in the method disclosed herein. For such resolution reduction, for example, a 4×4 field of shift registers is utilized and the sum of the individual elements of the shift register is employed as the evaluation criterion for the binary value of a new representative image point.

In one embodiment of the invention, the solder eye test is undertaken in two stages. The first stage examines the solder eyes on the basis of their specific shape by means of a pattern comparison, and upon recognizing a specific solder eye shape a further testing of the solder eye is undertaken to determine the existence of metallization at proper locations so that the completeness of the solder eye geometry can be determined.

The solder eye test may be undertaken, for example, in a field of 15×15 image points which can be parallelly tapped and is realized by a combination of digital shift registers. The pattern comparison may be undertaken, for example, with known correlation methods.

Two additional recognition devices are provided for the recognition of track interruptions and short circuits between adjoining tracks which are greater than the minimal geometries. A programmable resolution reduction unit is pre-connected to each of the two additional recognition devices which programmable resolution reduction unit is responsive to the associated minimum geometries.

In order to examine long track interruptions, a 3×3 field having parallel access is created by means of a combination of digital shift registers and an error indication is triggered only when the middle point of the field and one point away from the middle point can both be allocated to a single track.

For the discovery of short circuits between tracks which are longer than a nominal track width, a further embodiment of the invention utilizes a field of 5×5 image points having parallel access which is realized by a combination of digital shift registers and undertakes a comparison by means of a correlation unit with an error pattern which exists in eight angular orientations.

For connecting the respective error reports received from the test units with the location of the error, an error management or processing unit is provided in which the error reports received from the parallelly functioning error recognition circuits are combined and, after an appropriate transit time correction, are stored with associated position coordinates received from a position sensor on the compound table.

An error compression may be undertaken by the error management unit which combines individual error reports which are in close spatial proximity to form a total error signal in accord with the field of view available for visual classification. In this manner, defects extending over a plurality of image points which would ordinarily supply a plurality of error reports are combined into a single error report so that the plurality of errors is perceived as an overall single error. The stored error position coordinates are subsequently employed to move the test specimen to desired locations for visual classification.

The movement of the compound table carrying the test specimen is controlled by a sequence control which displaces the test specimen during a test in a meandering path beneath a lens with constant velocity. The sequence control is also utilized for the subsequent positioning of the test specimen at the error locations during the visual classification in the field of view of the lens according to the received error coordinates from the error management unit.

During visual observation, the errors can be viewed in a specific sequence by means of head actuation. Preferably, the error location in the field of view of the lens can be observed by a television monitor at an appropriate enlargement. The work interval between the test specimen and the lens is sufficiently large to allow repair of the error location while the test specimen remains on the compound table. An automatic marking device for marking the error location on the test specimen as is known in the art can be interconnected to the system.

DESCRIPTION OF THE DRAWINGS

FIG. 1 is a schematic block diagram of a complete opto-electronic test system constructed in accordance with the principles of the present invention.

FIG. 2 is a block diagram of the difference formation unit shown in FIG. 1.

FIG. 3 is a block diagram of the extreme value determination unit shown in FIG. 1.

FIG. 4 is a block diagram of the minimum geometry test unit shown in FIG. 1.

FIG. 6 is a block diagram of the solder eye test unit shown in FIG. 1.

FIG. 7 is a block diagram of the special geometry test unit shown in FIG. 1.

FIG. 7a is an error pattern for use in the open circuit test undertaken in the special geometry test unit shown in FIG. 7.

FIG. 7b is an error pattern for a short circuit test undertaken in the special geometry test unit of FIG. 7.

DESCRIPTION OF THE PREFERRED EMBODIMENTS

Figure 5:
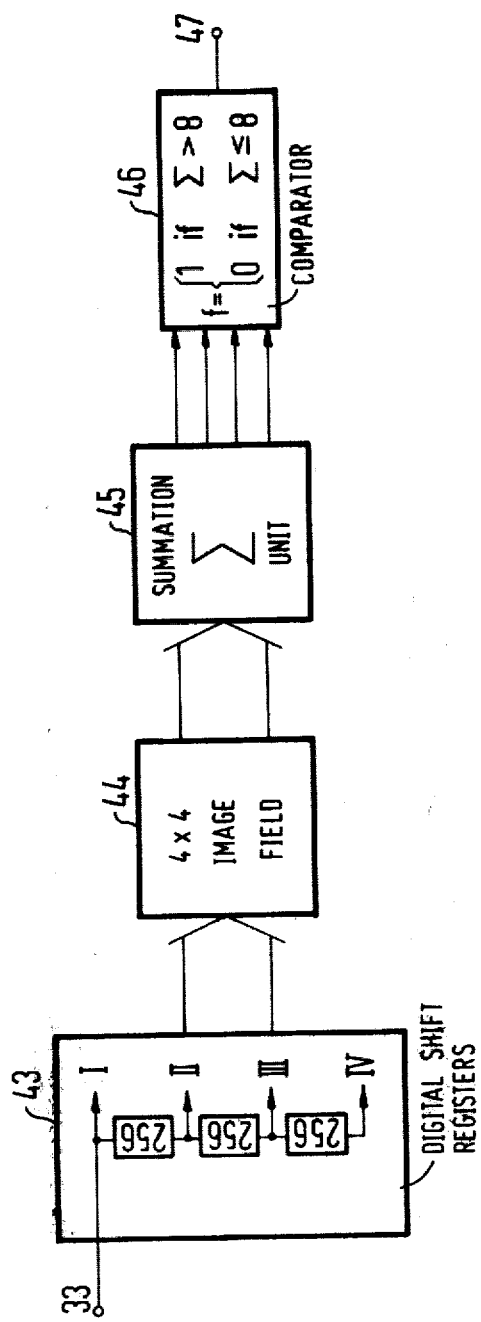
FIG. 5 is a block diagram of the resolution reduction unit shown in FIG. 1.

A schematic block diagram of a complete opto-electronic test system for automated quality testing of two-dimensional flat articles having a high density of geometric structure thereon is shown in FIG. 1. As shown therein, a movable compound table 1 has a test specimen 2 thereon disposed beneath a lens 3. A plate 4 is situated above the lens 3 which has a mirrored surface for reflecting a portion of light reflected off of the test specimen 2 from a light source (not shown) to a TV camera 5, and transmitting the remaining portion of the reflected light from the test specimen 2 to a semiconductor image sensor 6. A television monitor 7 is connected to the output of the camera 5 for visual observation of the test specimen 2 preferably with a suitable enlargement.

The semiconductor image sensor 6 may consist, for example, of a series of photodiode lines which generate a total of 256 image points. The output signal from the image sensor 6 is first supplied to an analog signal pre-processor 8 which includes a difference formation unit 9 and a post-connected extreme value determination unit 10, each of which is described more completely below.

The output of the analog signal pre-processor 8 is connected to a number of error recognition circuits which operate in parallel and in the embodiment shown consist of a minimum geometry test unit 11, a solder eye test unit 12 and a special geometry test unit 13. The minimum geometry test unit 11 includes a test unit 14 therein for examining track widths and a test unit 15 for examining insulation widths. The solder eye test unit 12 is comprised of a recognition unit 16 which determines that a solder eye is being examined and a measurement unit 17 for determining the completeness of the solder eye. The special geometry test unit 13 is comprised of a short circuit test unit 18 for determining the presence of short circuits in conductor runs, and an open circuit test unit 19 for determining the presence of open circuits in conductor runs. Each of the above units is more fully described below.

A resolution reduction unit 20 is interconnected between the solder eye test unit 12 and the output of the analog pre-processor 8 which reduces the field of view being examined by the solder eye test unit 12 by a factor of 4. A programmable resolution reduction unit 21 is interconnected between the special geometry test unit 13 and the output of the analog pre-processor 8 which is programmable to reduce the field of view being examined by the special geometry test unit 13 by a factor of n. These units are also more fully described below.

The various outputs of the test units 11, 12 and 13 are supplied in parallel to an error signal evaluator 22 which processes the received error signals and after linking each error signal with a set of position coordinates stores the error signal and the coordinates for subsequent use. The coordinates are determined by a position sensor of any suitable type known in the art which is associated with the compound table 1 which provides a position signal output to a sequence control unit 23 which in turn transmits the position information to the error signal evaluator 22. After a complete scan of the test specimen 2, which is undertaken in a meandering path, the error signal evaluator 22 provides signals to the sequence control unit 23 for re-positioning the compound table 1 at locations where an error is determined to be present for visual examination and classification of the error on the monitor 7.

The block diagram shown in FIG. 2 is an expansion of the difference formation unit 9 shown in FIG. 1. An input signal on a line 24 is supplied from the image sensor 6 to a series of analog shift registers 25 which delay the signal on a line-by-line basis. The shift registers 25 may, for example, be CCD shift registers, and may have an individual length of 256 image points. The outputs I through VI of these shift registers are conducted via separate lines to a 6×6 image field 26. The image field 26 is generated by a point-by-point delay of the signals I through VI in the column direction. Twenty points are selected from the field 26, belonging to the four spatial directions shown in FIG. 2 and are supplied via twenty separate lines to a differentiator 27. In each direction, the difference between two adjoining points of the six points in each line is determined and a weighting is given to each such difference depending upon the distance which the points lie from the center of the field. These calculations are undertaken for each of the four spatial directions and the sums of the weighted differences are subsequently compared to one another in each direction. The result which is greatest in terms of magnitude is allocated as the center point of the field 26. The weighted differential formations for each of the four directions are conducted over four separate lines to a maximum selector 28 which undertakes the comparisons shown therein and results in the selection of a differential formation which has the greatest magnitude.

The output of the maximum selector 28 in FIG. 2 serves as the input to a second series of analog shift registers 29 shown in FIG. 3. The signal received from the maximum selector 28 is therein delayed on a line-by-line basis by the shift registers. The shift registers may of the same type as described in connection with FIG. 2, that is, CCD shift registers having an individual length of 256 image points. The outputs I through V of the shift registers 29 are conducted by five separate lines to a 5×5 image field 30. This image field 30 is generated by means of a point-by-point delay of the signals I through V in the column direction. Seventeen points are selected from this field which belong to the four spatial directions shown in FIG. 3 and are supplied by seventeen separate lines to an extreme value recognition unit 31. The maximum of the input signals is detected by means of a correlation with a programmed function and transmits this signal to a binary image generator 32 which generates an edge vector $a_{m,n}$ which corresponds to the centerpoint m,n of the field 30. A reconstructed image signal 33 is achieved by means of evaluation of the edge vector $a_{m,n}$ and edge vectors $a_{m-1,n}$ and $a_{m,n-1}$ which precede the edge vector $a_{m,n}$ row-wise and column-wise.

The output signal 33 of the binary image generator 32 is transmitted to a first series of digital shift registers 34 shown in FIG. 4 which delay the signal 33 on a line-by-line basis. These digital shift registers 34 may, for example, be TTL shift registers having an individual length of 256 image points. The outputs I through X of these shift registers are conducted by separate lines to a 10×10 image field 35. This image field is generated by a point-by-point delay of the signals I through X in the column direction. Thirty-four points are selected from this field belonging to the four spatial directions shown in FIG. 4, and are supplied via thirty-four separate lines to a unit 36 for undertaking a determination of the track width, that is a conductor track, and simultaneously are transmitted to a unit 37 for undertaking an examination of the insulation width. A minimum insulation width can be programmed into a memory 38 and supplied to the insulation width examining unit 37, and a minimum track width can similarly be programmed into a memory 39 and supplied to the track width examining unit 36. In accordance with the minimum dimensions set by the memories 38 and 39, the signals received from the image field 35 are adapted as to length and in accordance with the four spatial directions shown in the unit 35. A schematically shown within the units referenced at 36 and 37, the continuous point sequences received from the image field 35 are examined as to a minimum width and the signals reformed in the units 36 and 37, which comprise a maximum length of ten image points and are connected in succession in the four spatial directions shown in the unit 35, are connected to a comparator store 40 which may, for example, be a ROM. The comparator store 40 has outputs 41 and 42. An error signal appears at the output 41 when a conductor track width falls below the minimum track width programmed into the memory 39, and an error signal appears at the output 42 when an insulation width falls below the minimum insulation width programmed into the memory 38. The units shown in FIG. 4 together comprise the minimum geometry test unit 11 shown in FIG. 1.

The output signal from the binary image generator 32 shown in FIG. 3 is simultaneously applied to the input of a resolution reduction unit 20 as shown in FIG. 1, and shown in greater detail in FIG. 5. The unit 20 has a plurality of digital shift registers 43 which may, for example, be TTL shift registers having an individual length of 256 image points. The outputs I through IV of these shift registers are conducted via four separate lines to a 4×4 image field 44. This image field is generated by a point-by-point delay of the signals I through IV in the column direction. The sixteen image points of this field are supplied via sixteen separate lines to a summation unit 45 which sums the inputs and supplies an output to a comparator 46 which supplies a high output if the sum is greater than eight and a low output if the sum is less than or equal to eight at an output line 47. The resolution of the area being viewed is thus reduced by a factor of four so that more data points can be supplied to the post-connected solder eye test unit 12 for examination of a larger area such as may be encompassed by various solder eye configurations.

As shown in FIG. 6, the solder eye test unit 12 consists of a series of digital shift registers 48 which receive their input from the line 47. The shift registers delay the input signal on a line-by-line basis and may, for example, be TTL shift registers having an individual length of 256 image points. The outputs I through XV of these shift registers are conducted by fifteen separate lines to a 15×15 image field 49. This image field is generated by a point-by-point delay of the signals I through XV in the column direction. From this field the image points are supplied via separate lines to a number of error recognition circuits which in the present embodiment consist of three circuits referenced at 50, 51 and 52. Each error recognition circuit corresponds to a different solder eye pattern and it will be understood that any number of such error recognition circuits may be utilized depending upon the number of solder eye patterns expected to be encountered.

As shown in FIG. 6, each unit 50, 51 and 52 respectively contains a memory for storing a particular solder eye pattern with circuit 50 having a memory 53A for a type "A" eye pattern, circuit 51 having a memory 53B for a type "B" solder eye pattern, and circuit 52 has a memory 53C for storing a type "C" eye pattern. The pattern in each of the memories is compared in a correlator 54 in each circuit which generates a recognition signal on line 55 if the input signal corresponds to the type of solder eye pattern stored in the respective memory. The signal on line 55 enables a measurement to be undertaken in an error signal generator 56 which examines the input signals to each circuit for metallization at specific locations within the solder eye pattern corresponding to the circuit. Upon a determination of the absence of metallization at a point where metallization should occur, an error signal 57 is generated by the generator 56. An identical operation is undertaken in the circuits 51 and 52 respectively if a "B" type pattern is recognized or a "C" type pattern is recognized.

The output signal 33 from the binary image generator 32 shown in FIG. 3 is simultaneously applied to the input of a programmable resolution reduction unit 21 shown in FIGS. 1 and 7 which operates in a manner identical to that described in FIG. 5 except that the number of shift registers and the correspondingly generated image field is programmable and is programmed in dependence upon the width of the track and insulation widths which were programmed into the minimum geometry test unit 11 in the memories 38 and 39. Those connections are not directly shown on FIG. 1, however, an input 58 to the unit 21 is shown in FIG. 7 for receiving this information. The purpose of the unit 21 is similar to that of the unit 20, that is, the unit reduces the resolution of the images supplied to the post-connected circuitry shown in FIG. 7 so that a number of data points representing a larger area can be examined and analyzed by the circuitry therein.

An output 59 of the unit 21 is connected to the input of a series of digital shift registers 60 which may, for example, be TTL shift registers each having a length of 256 image points. The outputs I through V of the shift registers are conducted via separate lines to a 5×5 image field 61. This image field is generated by means of a point-by-point delay of the signals I through V in the column direction. From the field 61, an inner region of nine image points is supplied to a comparator storage which may, for example, be a ROM in which an error pattern for a track interruption or open circuit, as is shown in FIG. 7a, is stored in eight directions. Also from the image field 61, the overall contents thereof consisting of twenty-five image points is supplied to a second comparator storage 64 in which an error pattern 65 for a short circuit, as is shown in FIG. 7b, is stored in eight directions. If the comparison is undertaken in either unit 62 or 64 results in a correspondence with the respective open or short circuit conditions shown in FIGS. 7a and 7b, an error signal respectively appears on the lines 66 or 67.

All of the outputs of the test units 11, 12 and 13 are supplied to an error signal evaluator 22 which may consist, for example, of a Siemens Microprocessor System SMP 80 having a data memory in which the instantaneous coordinates of the position sensor associated with the compound table 1 are read in with each occurrence of an error signal from any of the circuits 11, 12 or 13. Signal delays which occur as a result of processing in the error recognition circuits 11, 12 and 13 are compensated for by a transit time shift of the error coordinates in the data memory with respect to the location coordinates on the test specimen 2. Such compensation has already occurred when the error coordinates are read in. The error coordinates in the data memory of the microprocessor are subsequently employed during a test run to displace the compound table in such a manner that the error location becomes visible on the television monitor 7. In order to aid in the classification and evaluation and ultimate correction of errors lying in close proximity, error locations having a difference in coordinates which is less than an adjustable preselected amount are grouped together and evaluated and viewed as a single error. Such group evaluation of a number of individual errors in close proximity is known as error compression. The sequence control unit 23 is interconnected between the compound table 1 and the error signal evaluator 22 for transmittal in both directions of coordinate and error information during a testing process.

A complete test operation is as follows. At the beginning of a test series a format for the surface to be tested such as a printed circuit or an intermediate product used in the manufacture of printed circuits, is supplied to the system by inserting the test specimen 2 in the system on the compound table 1 and manually tracing the periphery of the specimen 2 with a measuring head of a type known in the art. This manually traced periphery is then utilized for all further tests within a single test series. A test cycle is then begun which consists of moving the test specimen 2 in a meandering path by movement of the compound table 1 beneath the lens 3. The data transmitted to the image sensor 6 is analyzed in the manner described above and at the end of a test cycle, the compound table is automatically moved to a first error position as controlled by the error signal evaluator 22 and the sequence control unit 23 which corresponds to the first set of coordinates at which a first error was determined to exist. The error can then be magnified and visually observed on the monitor 7. All subsequent stored errors are automatically viewed in sequence for visual examiniation by means of key actuation. After evaluating all errors, the compound table returns to a zero position so that the next test specimen 2 can be inserted.

Although automatic discrimination and evaluation of the electronic error reports from the units 11, 12 and 13 could be undertaken, such automatic discrimination would require substantial circuit outlay and would not appreciably increase the recognition certainty. The visual display of the error regions allows human evaluation of the area in which an error is present and increases the certainty of recognition of such an error because the area has been electronically selected and an operator thus knows that an error is present within the area and need only view the monitor in order to classify and correct the error.

Although modifications and changes may be suggested by those skilled in the art, it is the intention of the inventors to embody within the patent warranted hereon all changes and modifications as reasonably and properly come within the scope of their contribution to the art.

We claim as our invention:

1. An opto-electronic test system for automated quality control of two-dimensional test specimens having a high geometric structure density on a surface thereof comprising:

a semiconductor image sensor having a plurality of photo-diode lines;

a compound table disposed beneath said image sensor for moving said specimen beneath said sensor, said compound table having a position sensor for generating position coordinates corresponding to the position of the test specimen;

a lens disposed between said compound table and said image sensor for focusing light reflected from said test specimen onto said image sensor;

an analog signal pre-processor having an input connected to an output of said image sensor;

a plurality of error recognition circuits operating in parallel, each error recognition circuit having an input connected to an output of said analog pre-processor and undertaking different tests for recognition of errors;

an error signal evaluator having a plurality of inputs respectively connected to outputs of each of said error recognition circuits and further having an input for receiving test specimen position coordinates from said position sensor, said error signal evaluator combining each signal received from said error recognition circuits with the position coordinates associated therewith and storing said error signals and position coordinates until completion of an examination of said test specimen, said error signal evaluator controlling positioning of said test specimen after an examination thereof to move said test specimen to positions corresponding to an error; and a visual observation device for magnifying and viewing each of said error positions after an examination of said test specimen has occurred.

2. The test system of claim 1 wherein said error signal evaluator includes a means for generating a single error signal representing a plurality of error signals having spatial coordinates in an area which is less than a preselected area.

3. The test system of claim 1 wherein said observation device is a television monitor and wherein said lens is disposed a distance above said compound table sufficient to allow insertion of tools for repair of said error and wherein a mirrored plate is disposed between said lens and said image sensor for dividing said light reflected from said test specimen between said image sensor and a television camera connected to said television monitor.

4. The test system of claim 1 further comprising a sequence control interconnected between said compound table and said error signal evaluator for moving said test specimen beneath said image sensor in a meandering path with constant velocity and for controlling movement of said compound table to move said test specimen to an error location having error coordinates received from said error signal evaluator.

5. The test system of claim 4 wherein said sequence control has a key actuation for manual selection of the sequence in which error locations are viewed.

6. The test system of claim 1 wherein said analog signal pre-processor has an input consisting of a charge-coupled shift register.

7. The test system of claim 6 wherein said analog pre-processor has a means post-connected to said charge-coupled shift register for generating an edge structure by a four-dimensional differential formation of a field of 6×6 image points and a means for assigning a weighting to each differential formation and for assigning the difference having a greatest magnitude to the center of said 6×6 field.

8. The test system of claim 7 wherein said analog pre-processor further includes a binary image generator for generating a binary image from said edge structure.

9. The test system of claim 8 wherein said analog pre-processor further includes an extreme value recognition unit for determining the extreme value of said difference formations in each direction, and wherein said binary image generator is connected to said extreme value recognition unit and generates said binary image from said extreme values.

10. The test system of claim 1 wherein said test specimen is a printed circuit having a plurality of conductor tracks thereon separated by insulation and having a plurality of solder eyes thereon, and wherein said error recognition circuits comprise:
   a minimum geometry test unit for testing minimum track and insulation widths;
   a solder eye test unit for testing the shape and completeness of solder eyes; and
   a special geometry test unit for testing for track interruptions and short circuits between adjoining tracks.

11. The test system of claim 10 wherein each said error recognition circuit includes a means for comparing a structure to be tested in a plurality of directions with programmed minimum geometries corresponding to a respective structure to be tested.

12. The test system of claim 11 wherein said binary image is stored at the input of said minimum geometry test unit in a 10×10 image point field.

13. The test system of claim 12 wherein said minimum geometry test unit has a first comparator connected to a minimum track width store for comparing points in said 10×10 image field with the contents of said minimum track widths store; a second comparator connected to a minimum insulation width store for comparing points in said 10×10 image field with the contents of said minimum insulation width store; and a read only memory having inputs received from said first and second comparators and having a first output at which an error signal appears when a track width compared in said first comparator is less than the minimum track width in said minimum track width store, and a second output at which an error signal appears when an insulation width compared in said second comparator is less than said minimum insulation width in said minimum insulation width store.

14. The test system of claimm 10 wherein a first resolution reduction unit is interconnected between said output of said analog pre-processor and said solder eye test unit and a second resolution reduction unit is interconnected between said output of said analog pre-processor and said special geometry test unit.

15. The test system of claim 14 wherein said first resolution reduction unit is comprised of a series of digital shift registers for generating a 4×4 image field;
   a summation unit connected to said 4×4 image field for summing the individual elements thereof; and
   a comparator connected to said summation unit for comparing the sums therefrom and providing a high output if said sum is larger than a preselected value, and providing a low out if said sum is less than or equal to said preselected value.

16. The test system of claim 14 wherein said solder eye test unit is comprised of:
   a first means connected to said first resolution reduction unit for comparing said binary image field with a solder eye pattern which generates an enabling signal upon correlation of said binary image field with said solder eye pattern; and
   a second means connected to said first means for examining said binary image signal at preselected locations to determine the presence of metallization at said locations, said second means enabled by said enabling signal from said first means and generating an error signal upon a determination that metallization is absent at one of said selected locations.

17. The test system of claim 16 wherein said solder eye test unit further includes a series of digital shift registers for generating a 15×15 image field which serves as said binary image field.

18. The test system of claim 10 wherein said second resolution reduction unit includes a series of digital shift registers for generating a programmable field of selected size and wherein said second resolution reduction unit is connected to said minimum insulation width store and said minumum track width store in said minumum geometry test unit for supplying said selected size to said second resolution reduction unit.

19. The test system of claim 18 wherein said special geometry test unit comprises:
   a series of digital shift registers for generating a 5×5 image field from said binary image field; and
   a means for generating an error signal when a centerpoint of said 5×5 image field and at least one other point of said field are within said minimum track width from said minimum track width store.

20. The test system of claim 18 wherein said special geometries test unit is comprised of:
   a series of digital shift registers for generating a 5×5 image field from said binary image field; and
   a means for generating an error signal when points on adjacent conductor tracks are closer than said minimum insulation width.

* * * * *